United States Patent [19]

Latham et al.

[11] Patent Number: 5,011,872

[45] Date of Patent: Apr. 30, 1991

[54] THERMALLY CONDUCTIVE CERAMIC/POLYMER COMPOSITES

[75] Inventors: Carol A. Latham, Lakewood; Michael F. McGuiggan, Shaker Heights, both of Ohio

[73] Assignee: The Carborudum Company, Niagara Falls, N.Y.

[21] Appl. No.: 327,067

[22] Filed: Mar. 22, 1989

Related U.S. Application Data

[63] Continuation of Ser. No. 135,785, Dec. 21, 1987.

[51] Int. Cl.$^5$ .............................................. C08L 63/00
[52] U.S. Cl. .................................... 523/440; 523/443; 524/404; 524/428; 524/443
[58] Field of Search ................ 523/440, 443; 524/404, 524/428, 443

[56] References Cited

U.S. PATENT DOCUMENTS

| | | | |
|---|---|---|---|
| 2,871,216 | 1/1959 | Anderson | 260/41.5 |
| 3,261,800 | 7/1966 | Collins | 260/37 |
| 3,652,491 | 3/1972 | Nelson et al. | 260/41 |
| 3,972,821 | 8/1976 | Weidenbenner et al. | 252/75 |
| 4,129,550 | 12/1978 | Nametkin et al. | 260/42.22 |
| 4,210,774 | 7/1980 | Perry | 174/140 R |
| 4,233,077 | 11/1980 | Hazel | 106/43 |
| 4,528,307 | 7/1985 | Fuhr et al. | 523/440 |
| 4,562,488 | 1/1986 | Minami et al. | 523/222 |
| 4,588,788 | 5/1986 | Nir et al. | 525/115 |
| 4,826,896 | 5/1989 | Procter | 523/443 |

FOREIGN PATENT DOCUMENTS

| | | |
|---|---|---|
| 2307351 | 2/1977 | France . |
| 2152060A | 7/1985 | United Kingdom . |

OTHER PUBLICATIONS

Abstract No. 104: 6945z, "Thermally Conductive Electric Insulator for Mounting Solid-state Devices".
Abstract No. 105:25502q, "Potting Semiconductor Devices".
Abstract No. 103:216581h, "Prepress with High Thermal Conductivity".
Abstract No. 93:196556y, "Multilayer Printed Circuit Board".
Abstract No. 104:51603x, "Thermal Conductors".
Abstract No. 103:55201s, "Epoxy Resin Potting Compositions".
Abstract No. 103:55096m, "Epoxy Resin Composition for Cast Molding Electric Circuits".
Abstract No. 105:192579b, "Thermoconductive Adhesives".
Abstract No. 92:143265k, "Silicone Rubber Electric Insulators Having Good Thermal Conductivity".
Abstract No. 93:27563t, "Silicon Rubber Electric Insulators Having Good Thermal Conductivity".
Abstract No. 102:25938z, "Epoxy Resin Potting Compositions".

*Primary Examiner*—Melvyn I. Marquis
*Assistant Examiner*—Karen A. Hellender
*Attorney, Agent, or Firm*—Larry W. Evans; Joseph G. Curatolo; Michael F. Esposito

[57] ABSTRACT

A thermal conductive polymer composition comprising a mixture of a polymer and a thermally conductive filler material, said filler material having a median particle size of between about 130 to 260 microns and a size distribution characterized by the formula:

$$\frac{\% < (M - 60)}{\% > (M + 60)} > 0.60$$

where % represents the wt. % of the particles below or above the median particle size and M represents the median particle size in microns.

10 Claims, No Drawings

THERMALLY CONDUCTIVE CERAMIC/POLYMER COMPOSITES

This is a continuation of co-pending application Ser. No. 135,785 filed Dec. 21, 1987.

BACKGROUND OF THE INVENTION

This invention is directed to a thermally conductive material useful as a heat transfer material for electrical components. In particular, the present invention relates to a novel ceramic-polymer composition which may be used as an adhesive for attaching electrical components to printed circuit boards, high power components such as transistors to heat sinks, laminates, hybrid substrates for electrical components and, finally, encapsulating compositions for use in integrated circuits where dissipation of heat is a critical requirement of the encapsulant.

The dramatic increase in circuit density in today's microcircuitry has lead to the attendant problem of heat generation. It is well known that the reliability of the microcircuit is directly affected by its ability to dissipate the heat generated. Electrical components which generate heat must have a means for heat removal in order to function properly. Numerous attempts to alleviate the problem of dissipation of heat have been made including encapsulating or attaching the electrical component to the substrate with a polymer material filled with a ceramic filler to aid in heat dissipation. Specific examples of these types of materials can be found in U.S. Pat. No. 3,908,040 and U.S. Pat. No. 4,265,775. Each of these patents disclose various polymer materials having heat dissipating ceramic fillers therein and their use as encapsulants or adhesives for electrical components. The present invention is directed to an improved thermally conductive polymer composite which is characterized by significant thermal conductive (heat dissipation) properties.

SUMMARY OF THE INVENTION

It is the primary object of the present invention to provide a novel thermal conductive polymer composite which has good heat dissipation properties.

It is another of the present invention to provide a novel thermal conductive composite having a thermal conductivity in the range of between 10 to 20 W/m° K.

Additional objects and advantages of the invention will be set forth in part in the description which follows and in part will be obvious from the description or may be learned by practice of the invention. The objects and advantages of the invention may be realized and attained by means of the instrumentalities and combinations particularly pointed out in the appended claims.

To achieve the foregoing objects and in accordance with the purpose of the present invention as embodied and broadly described herein, the thermally conductive polymer composition of the present invention comprises a mixture of a polymer material and a thermally conductive inorganic filler having a median particle size between the range of 130 to 260 microns. Moreover, the particle size distribution should be such that the ratio of the percent of small particles (particles less than the median (M) minus 60 microns) to the percent of large particles (particles greater than the median (M) plus 60 microns) is greater than 0.60.

In a preferred embodiment of the present invention, the inorganic filler is a ceramic material having a purity of greater than or equal to 98%, most preferably greater than 98.5%.

In a further preferred embodiment the inorganic filler is a plate-like ceramic powder.

In a still further preferred embodiment of the present invention, the thermal conductivity of the polymer matrix composite is greater than 10 W/m° K., preferably in the range of 10-20 W/m° K.

In another embodiment of the present invention, the process for producing the polymer composition comprises selecting a polymer matrix and thermally conductive filler characterized as set forth above, mixing the materials under low shear conditions and curing the resulting composite (mixture) at an elevated temperature and pressure.

The novel composites of the present invention have shown a remarkably greater thermal conductivity compared to known polymer composites. In addition, the composites have greater ease of processing and because they contain inert fillers, reduce the fear of ionic migration in electronic applications. Due to the high thermal conductivity of the composites of the present invention, the life of the electronic components wherein these composites are utilized is significantly increased and catastrophic failure of the electronic components can be substantially avoided.

DETAILED DESCRIPTION OF THE INVENTION

Reference will now be made in detail to the present preferred embodiments of the invention.

The composition of the present invention comprises an inorganic filler and a polymer carrier or matrix. Preferably, the inorganic filler is selected from ceramic materials such as boron nitride, aluminum nitride and silicon carbide. However, it should be understood that other thermal conductive fillers such as silver may be utilized in the practice of the present invention. It is further preferred that the filler be a plate-like or lamellar powder as opposed to spherical in form. Most preferably, the plate-like filler should have an aspect ratio of between 3-40, preferably 10-30, most preferably 15-25.

The polymer carrier material may be either a thermoplastic or a thermosetting material. Typical examples of thermosetting materials include epoxies, silicones, phenolics, polyesters, polyimides and acrylonitriles. Thermoplastic materials such as polyethylene, acrylics, vinyls and fluorocarbons are envisioned as suitable for the practice of the invention. Typically, carrier materials must be stable at temperatures of −50° C. to 150° C.

The ceramic filler should be carefully characterized to satisfy the specific particle size distribution with a median particle size between 130 and 260 microns. To achieve the unique results of the present invention, the particle size distribution should be such that the ratio of the percent of small particles (particles less than the median (M) minus 60 microns) to the percent of large particles (particles greater than the median (M) plus 60 microns) is greater than 0.60. This can be stated arithmetically as follows:

$$\frac{\% < (M - 60)}{\% > (M + 60)} > 0.60$$

where % presents the weight percent of the particles above or below the described median particle size and M represents the median particle size in microns.

In a further preferred embodiment of the present invention, the surface area of the thermal filler is less than 10 m²/g, preferably less than 5 m²/g. It has been found that the low surface area gives composites which have higher thermal conductivities.

In a still further preferred embodiment of the present invention, the ceramic filler should have a high degree of purity. In particular, the ceramic filler should be at least 98% pure, most preferably at least 98.5% pure. For example, if boron nitride powders are used as a ceramic filler, they should contain at least 98% boron and nitrogen with at most 2% impurities, most preferably 98.5% boron and nitrogen.

The volume concentration of the ceramic filler in the composite is not particularly critical. Thermal conductivity can be optimized using 50 volume % filler to polymer matrix. However, a composite with 25 volume % filler has been demonstrated to have sufficiently good thermal conductivity in the practice of the present invention. Preferably, the volume % of filler in the composite can vary from 75 to 10%.

In a further embodiment of the present invention, the process of producing the polymer composite comprises selecting a polymer matrix and adding to the matrix a thermal conductive inorganic filler having a median particle size and size distribution as described previously. The resulting mixture is then mixed under low shear conditions which are defined for purposes of this invention as mixing at a speed insufficient to damage or destroy the original shape of the inorganic thermal conductive filler added to the polymer matrix. A suitable means for mixing under low shear conditions can be achieved by using a double planetary mixer manufactured by Ross Mixing Co. After the filler has been mixed with the polymer matrix the resulting composite is cured at an elevated temperature and pressure.

The temperatures used in curing or processing the composites of the present invention will be governed by the polymer system used as the carrier or matrix and by the end use of the composite. For example, an epoxy/boron nitride composite to be used as an adhesive for an electronic component would need a cure temperature between ambient and 300° C. On the other hand, a fluorocarbon/boron nitride composite to be used in a printing wiring board or substrate fabrication could withstand considerably higher processing temperatures (i.e. 450° C.). It is envisioned in the practice of the present invention that the temperature for curing or processing of the composites can vary between 50° C. to 500° C. depending on the various polymer carriers used in the composite and the end use of the composite.

The application of pressure during curing of the composite may be utilized advantageously to increase thermal conductivity. For example, the use of at least 20 psi, preferably greater than 40 psi, has been utilized during curing of the composite.

The addition of other additives such as conventional plasticizers, swelling agents, flexibilizers, coupling agents, etc. can be used in conjunction with the ceramic filler to provide characteristics as needed for specific applications. Selection of these conventional materials is well known in the art and does not form a part of the present invention. To further illustrate the practice of the present invention, the following examples are presented.

EXAMPLE 1

The epoxy, Masterbond EP110F6 (manufactured by Masterbond Co.), was prepared according to manufacturer's directions. That is, 100 parts of resin (component A) was mixed with 200 parts of hardener (component B). 3.38 g of boron nitride powder A (see Table I for characterization) was dispersed in 1.50 grams of the epoxy under low shear conditions utilizing a double planetary mixer manufactured by Ross Mixing Co. The sample was cured in a cylindrical die with a diameter of 0.5" at 135° C. and 40 psi for 2 hours. The cured rod was sliced into a disc ~2 mm thick and analyzed by the laser-flash technique for thermal diffusivity.

From this thermal conductivity was then calculated using specific heat and density. See Table II, Powder A, 50 volume % for the results.

EXAMPLE 2

The procedure of Example 1 was followed except Powder B was used. See Tables I and II below for the characterization of Powder B and the results obtained.

EXAMPLE 3

The procedure of Example 1 was followed except Powder C was used. See Tables I and II below for the characterization of Powder C and the results obtained.

EXAMPLE 4

The procedure of Example 1 was followed except Powder D was used. See Tables I and II below for the characterization of Powder D and the results obtained.

EXAMPLE 5

The procedure of Example 1 was followed except Powder E was used. See Tables I and II below for the characterization of Powder E and the results obtained.

EXAMPLE 6

The procedure of Example 1 was followed except Powder F was used. See Tables I and II below for the characterization of Powder F and the results obtained.

TABLE I

BORON NITRIDE POWDER CHARACTERIZATION

| Boron Nitride Powder | Median Particle Size Microns (M) | % Boron + Nitrogen Minimum | % ≤ (M − 60) % > (M + 60) | Surface Area (m²/g) |
|---|---|---|---|---|
| A | 240 | 98.5 | 0.80 | 2.8 |
| B | 13 | 98.5 |  | 8.9 |
| C | 243 | 98.5 | 0.44 |  |
| D | 235 | 95.0 | 0.80 | 3.2 |
| E | 218 | 98.0 | 0.93 | 4.5 |
| F | 170 | 99.0 | 1.20 | 2.1 |

TABLE II

BORON NITRIDE/EPOXY COMPOSITE RESULTS

| Boron Nitride Powder | Thermal Conductivity Watts/Meter °K. | Volume % Boron Nitride |
|---|---|---|
| A | 18.3 | 50 |
| A | 11.9 | 30 |
| B | 4.3 | 50 |
| C | 6.3 | 50 |
| D | 8.0 | 50 |
| E | 3.6 | 50 |
| F | 14.0 | 50 |

As can be readily seen from the results set forth in Tables I and II above, the practice of the present invention provides a composite having extremely good thermal conductivity. It is a requirement of the composite material that the median particle size range between 130 to 260 microns and that the particle size distribution according to the above-described formula be greater than 0.60. In addition, the purity of the ceramic filler material should be greater than 98%, most preferably 98.5%.

The foregoing description of the preferred embodiments of the present invention have been presented for purposes of illustration and description. They are not intended to be exhaustive or to limit the invention to the precise form disclosed, and obviously many modifications and variations are possible in light of the above teachings. The embodiments are chosen are described in order to best explain the principles of the invention in its practical applications to thereby enable others skilled in the art to best utilize the invention in various embodiments and with various modifications as are suited to the particle use contemplated. It is intended that the scope of the invention be defined by the claims appended hereto.

What is claimed is:

1. A thermal conductive polymer composition comprising a mixture of a polymer and a thermally conductive filler material, said filler material having a median particle size of between about 130 to 260 microns and a size distribution characterized by the formula:

$$\frac{\% < (M - 60)}{\% > (M + 60)} > 0.60$$

where % represents the wt. % of the particles below or above the median particle size and M represents the median particle size in microns.

2. The composition of claim 1 wherein the filler material is an inorganic material.

3. The composition of claim 2 wherein the filler is plate-like in shape.

4. The composition of claim 3 wherein the filler is a ceramic material selected from the group consisting of BN, SiC and AlN.

5. The composition of claim 1 wherein the surface area of the filler material is less than 10 m$^2$/g.

6. The composition of claim 5 wherein the surface area of the filler material is less than 5 m$^2$/g.

7. The composition of claim 4 wherein the ceramic material has a purity of at least 98% by weight.

8. A process for producing a thermal conductive polymer composite comprising selecting a polymer matrix material and a thermal conductive filler, wherein said filler material has a median particle size of between about 130 to 260 microns and a size distribution characterized by the formula:

$$\frac{\% < (M - 60)}{\% > (M + 60)} > 0.60$$

where % represents the wt. % of the particles below or above the median particle size and M represents the median particle size in microns, mixing said polymer and filler together under low shear conditions and curing said mixture at an elevated temperature and pressure.

9. The process of claim 8 wherein the filler material is selected from the group consisting of BN, SiC and AlN.

10. The process of claim 9 wherein the filler material is selected to have a purity of at least 98% by weight.

* * * * *